US011300614B1

(12) United States Patent
Cron (10) Patent No.: US 11,300,614 B1
(45) Date of Patent: Apr. 12, 2022

(54) SAVE AND RESTORE REGISTER (71) Applicant: Synopsys, Inc., Mountain View, CA (US)

(72) Inventor: Adam Cron, Hilton Head Island, SC (US)

(73) Assignee: Synopsys, Inc., Mountain View, CA (US)

( * ) Notice: Subject to any disclaimer, the term of this patent is extended or adjusted under 35 U.S.C. 154(b) by 11 days.

(21) Appl. No.: 17/061,871

(22) Filed: Oct. 2, 2020

Related U.S. Application Data (60) Provisional application No. 62/910,821, filed on Oct. 4, 2019.

(51) Int. Cl.
| | |
|---|---|
| *G01R 31/317* | (2006.01) |
| *G01R 31/3185* | (2006.01) |
| *G06F 9/30* | (2018.01) |
| *G01R 31/3177* | (2006.01) |
| *G06F 9/46* | (2006.01) |

(52) U.S. Cl.
CPC ... *G01R 31/31723* (2013.01); *G01R 31/3177* (2013.01); *G01R 31/31727* (2013.01); *G01R 31/318572* (2013.01); *G06F 9/30127* (2013.01); *G06F 9/462* (2013.01)

(58) Field of Classification Search
CPC ........ G01R 31/31723; G01R 31/31727; G01R 31/3177; G01R 31/318572; G06F 9/30127; G06F 9/462
USPC .......................... 714/724, 726, 727, 729, 731
See application file for complete search history.

(56) References Cited

U.S. PATENT DOCUMENTS

| | | | | |
|---|---|---|---|---|
| 4,733,346 | A  * | 3/1988 | Tanaka ..................... | G06F 9/462 712/228 |
| 5,631,911 | A  * | 5/1997 | Whetsei, Jr. ... | G01R 31/318541 714/727 |
| 6,223,279 | B1 * | 4/2001 | Nishimura .......... | G06F 15/7842 712/228 |
| 7,716,545 | B2 * | 5/2010 | Shimooka ............. | G06F 1/3203 714/726 |
| 2019/0189192 | A1* | 6/2019 | Kim ....................... | G11C 7/106 |

* cited by examiner

*Primary Examiner* — John J Tabone, Jr.
(74) *Attorney, Agent, or Firm* — Sterne, Kessler, Goldstein & Fox P.L.L.C.

(57) ABSTRACT

A save and restore (SR) register system is disclosed. Some embodiments include a first memory state element (MSE), a second MSE, and a control circuit. The first MSE is configured to: clock in a first data value during a normal mode and hold the first data value during a first testing mode; and clock in a first test sequence during a second testing mode. The second MSE is configured to: clock in the first data value during the normal mode; and clock in a second test sequence during the first testing mode. The control circuit configured to: restore the second MSE to the first data value based on an output port of the first MSE after the second MSE clocks in the second test sequence; and restore the first MSE based on an output port of the second MSE after the first MSE clocks in the first test sequence.

20 Claims, 6 Drawing Sheets

Truth Table 297

| Control FF 205 | Save Signal 175 | Restore Signal 170 | Register Output Signal 199A |
|---|---|---|---|
| 0 | 0 | 0 | MSE A1 190A |
| 1 | 0 | 0 | MSE A2 195A |
| 0 | 1 | 0 | MSE A1 190A |
| 0 | 1 | 1 | MSE A1 190A |

← Hold MSE A2 195A

← Restore MSE A1 190A

SAVE AND RESTORE REGISTER

CROSS-REFERENCE TO RELATED APPLICATIONS

This application is a non-provisional application of U.S. Provisional Patent Application Ser. No. 62/910,821, which was filed on Oct. 4, 2019. Accordingly, this application claims priority under 35 U.S.C. § 119(e) to U.S. Provisional Patent Application Ser. No. 62/910,821. U.S. Provisional Patent Application Ser. No. 62/910,821 is hereby incorporated by reference in its entirety.

TECHNICAL FIELD

The present disclosure relates generally to in-system testing of electronic circuits. In particular, the present disclosure relates to a save and restore (SR) register system.

BACKGROUND

Although circuits are often tested immediately after the manufacturing process, it is often necessary for the circuits or sub-components of these circuits to be routinely re-tested in their entirety once the circuits have been deployed in various systems. In fact, various standards exist that demand in-system test coverage. These standards are especially prevalent in critical systems (e.g., a system involving the brakes of an automobile, a medical device, a nuclear reactor control, and a railway signaling system).

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

In the drawings, like reference numbers generally indicate identical or similar elements. Additionally, generally, the left-most digit(s) of a reference number identifies the drawing in which the reference number first appears.

DETAILED DESCRIPTION

Aspects of the present disclosure relate to a save and restore (SR) register and register system that can meet the high levels of in-system test coverage demanded by some standards. A SR register may include a functional memory state element (MSE) (such as a flip-flop) and an ancillary holding MSE (such as a latch). In designs with logic built-in self-testing (logicBIST), using such a SR register has been considered to save, or hold, a "local" state while the logicBIST is running, and then restore that state to the functional register after logicBIST completes, and normal system operation is again initiated. An issue with such a SR register is that the holding latch, itself, is not tested, which may violate in-system testing.

In the present disclosure, the present system and method utilizes a control circuit and a SR register with duplicate MSEs for providing in-system testing. The control circuit toggles the SR register between two testing modes: a first testing mode and a second testing mode. During the first testing mode, a first MSE is under test while a second MSE is used to restore the MSE under test once the testing is finished. During the second testing mode, the roles of the first MSE and the second MSE are switched. In other words, the first MSE under test in the first testing mode becomes the hold MSE in the second testing mode, while the second MSE in the first testing mode becomes the MSE under test in the second testing mode. Once the first testing mode and the second testing mode are completed, the entire SR register has been tested.

Figure 1:
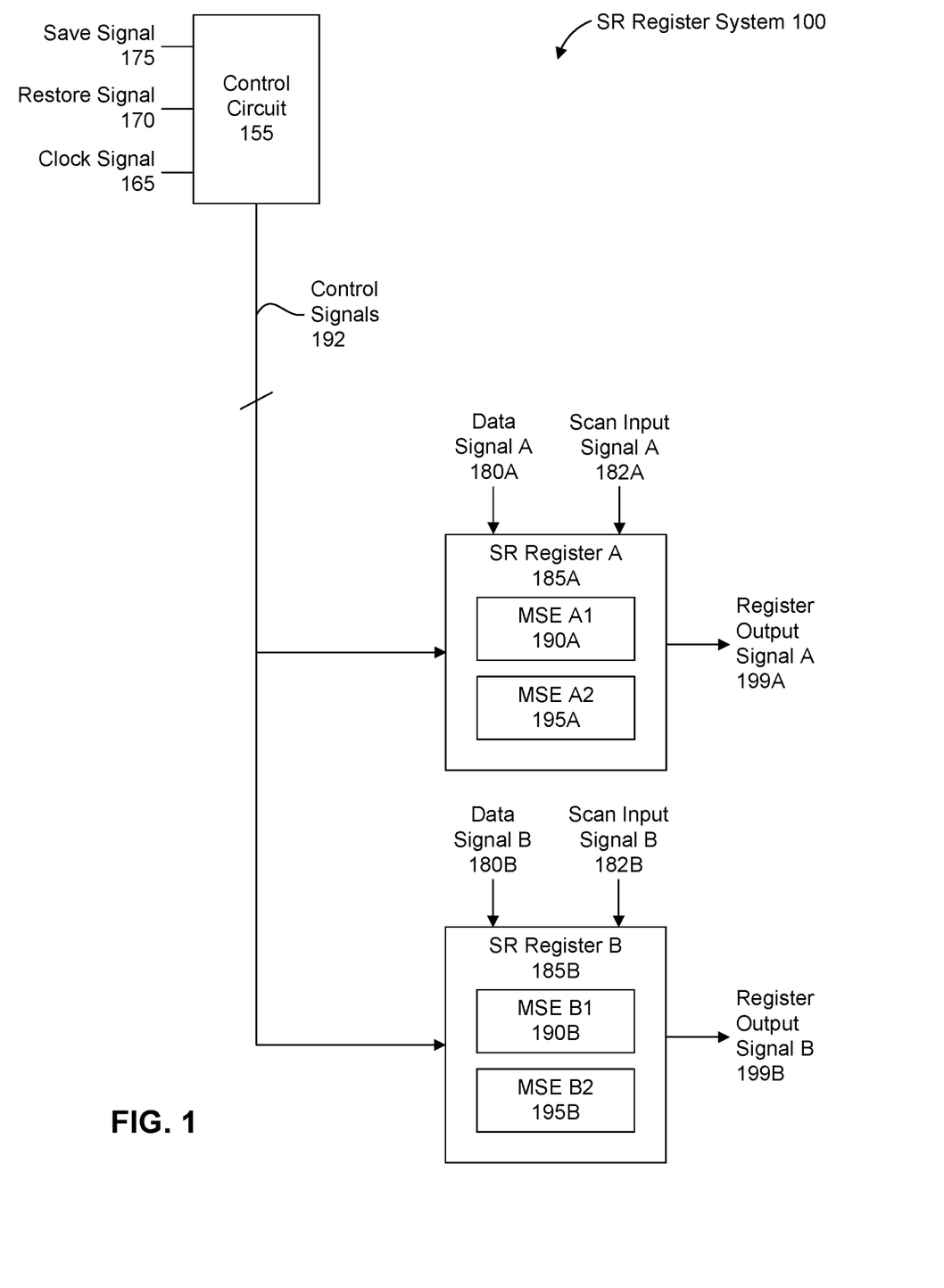
FIG. 1 depicts a save and restore (SR) register system in accordance with one or more embodiments.

FIG. 1 depicts an SR register system 100 in accordance with one or more embodiments. As depicted in FIG. 1, SR register system 100 includes control circuit 155 connected to one or more SR registers (e.g., SR register A 185A, SR register B 185B). Control circuit 155 inputs save signal 175, restore signal 170, and clock signal 165. Control circuit 155 generates control signals 192 based on one or more of save signal 175, restore signal 170, and clock signal 165. In one or more embodiments, one of the control signals 192 may be restore signal 170 (e.g., control circuit 155 may generate restore signal 170 or be a pass-through for restore signal 170).

In one or more embodiments, each SR register 185 inputs respective data signal 180 and scan input signal 182, and each SR register 185 outputs respective register output signal 199. For example, SR register A 185A inputs data signal A 180A, inputs scan input signal 182A, and outputs register output signal A 199A. Similarly, SR register B 185B inputs data signal B 180B, inputs scan input signal 182B, and outputs register output signal B 199B.

In one or more embodiments, each SR register 185 includes a pair of memory state elements (MSEs) 190. As depicted in FIG. 1, SR register A 185A includes MSE A1 190A and MSE A2 195A, while SR register B 185B includes MSE B1 190B and MSE B2 195B. Each MSE may correspond to a flip-flop (FF) (e.g., a D-type FF).

In one or more embodiments, SR register system 100 is configured to operate in four modes: a first normal mode, a second normal mode, a first testing mode, and a second testing mode. SR register system 100 may operate in one of the normal modes when save signal 175 is not asserted. However, each time there is a rising edge of save signal 175, a testing mode is triggered. The first testing mode is triggered by the rising edge of save signal 175 if the previous testing mode was the second testing mode. Similarly, the second testing mode is triggered by the rising edge of save signal 175 if the previous testing mode was the first testing mode. In other words, there is a toggle between the first testing mode and the second testing mode.

During both normal modes, the data values arriving via the data signal 180 are clocked into both MSEs of a respective SR register 185. The register output signal 199 is the output of MSE 195 during the first normal mode and the output of MSE 190 during the second normal mode.

For example, during both normal modes, the data values arriving via data signal A 180A are clocked into both MSE A1 190A and MSE A2 195A. In other words, during the normal modes, MSE A1 190A and MSE A2 195A store the same data values at the same time. During the first normal mode, register output signal A 199A is the output of MSE A2 195A. During the second normal mode, register output signal A 199A is the output of MSE A1 190A.

Similarly, during both normal modes, the data values arriving via data signal B 180B are clocked into both MSE B1 190B and MSE B2 195B. In other words, during the normal modes, MSE B1 190B and MSE B2 195B store the same data values at the same time. Further, during the first normal mode, register output signal B 199B is the output of MSE B2 195B. During the second normal mode, register output signal A 199A is the output of MSE B1 190B.

In the first testing mode, one of the MSEs in the SR register 185 is under test and clocks in a test sequence (e.g., test values) arriving via the scan input signal 182. The other MSE in the SR register 185 holds, for at least the duration of the first testing mode, the last data value stored in the MSE before the first testing mode started. Moreover, the register output signal 199 is the output of the MSE under test.

For example, during the first testing mode, the test sequence arriving via scan input signal A 182A is clocked into MSE A2 195A, while MSE A1 190A holds, for at least the duration of the first testing mode, the last data value stored in MSE A1 190A before the first testing mode started. Further, during the first testing mode, register output signal A 199A is the output of MSE A2 195A (i.e., the MSE under test and being driven with the test sequence).

As another example, during the first testing mode, the test sequence arriving via scan input signal B 182B is clocked into MSE B2 195B, while MSE B1 190B holds, for at least the duration of the first testing mode, the last data value stored in MSE B1 190B before the first testing mode started. Further, during the first testing mode, register output signal B 199B is the output of MSE B2 195B (i.e., the MSE under test and being driven by the test sequence).

In the second testing mode, the other MSE is now under test. For example, during the second testing mode, the test sequence arriving via scan input signal A 182A is clocked into MSE A1 190A, while MSE A2 195A holds, for at least the duration of the second testing mode, the last data value stored in MSE A2 195A before the second testing mode started. Further, during the second testing mode, register output signal A 199A is the output of MSE A1 190A (i.e., the MSE under test and being driven with the test sequence).

As another example, during the second testing mode, the test sequence arriving via scan input signal B 182B is clocked into MSE B1 190B, while MSE B2 195B holds, for at least the duration of the second testing mode, the last data value stored in MSE B2 195B before the second testing mode started. Further, during the second testing mode, register output signal B 199B is the output of MSE B1 190B (i.e., the MSE under test and being driven with the test sequence).

In one or more embodiments, at the end of a testing mode, the MSE under test is restored to the data value being stored by the other MSE in the SR register. For example, at the end of the first testing mode, MSE A2 195A is restored to the data value stored by MSE A1 190A, while MSE B2 195B is restored to the data value stored by MSE B1 190B. As another example, at the end of the second testing mode, MSE A1 190A is restored to the data value stored by MSE A2 195A, while MSE B1 190B is restored to the data value stored by MSE B2 195B. The restoring process may be triggered by a pulse on restore signal 170.

Regardless of whether the SR register 100 system is operating in the first testing mode or the second testing mode, a testing apparatus or testing circuit (not shown) may feed the test sequences to an SR register 185 via the scan input signal 182, and then compare the register output signal 199 with expected values to determine whether the MSE under test is operating as expected, or whether the MSE under test has failed.

Although FIG. 1 shows a single control circuit 155 connected to multiple SR registers 185, in other embodiments, each SR register has its own control circuit and the control circuit may be integrated with (not separate as shown in FIG. 1) the corresponding SR register.

Those skilled in the art, having the benefit of this detailed description, will appreciate that by operating in the first testing mode and then the second testing mode (or the reverse), both MSEs in an SR register will be tested. In other words, the SR register completely checks itself in an in-system logicBIST environment once the logicBIST is run twice. Further, those skilled in the art, having the benefit of this detailed description, will appreciate that the duplicate MSEs in a single SR register 185 provide the mechanism to restore the MSE under test to its pre-testing data value at the end of the testing mode.

Figure 2A:
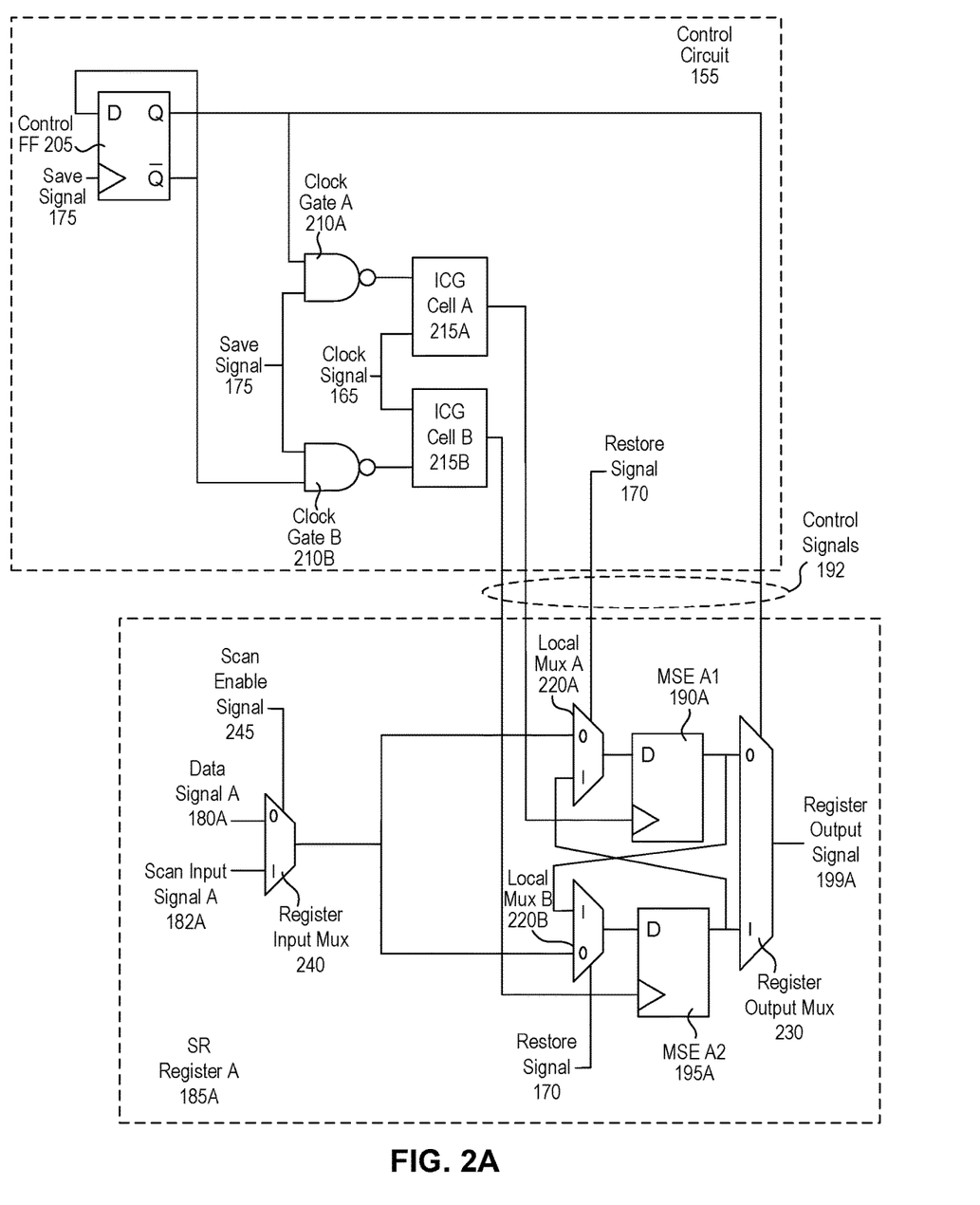
FIG. 2A depicts an example SR register and an example control circuit in accordance with one or more embodiments.

FIG. 2A depicts an example of SR register A 185A and control circuit 155 in accordance with one or more embodiments. As shown in FIG. 2A, control circuit 155 includes a control FF 205, one or more clock gates (e.g., clock gate A 210A, clock gate B 210B) (e.g., NAND gates), and one or more integrated clock gating (ICG) cells (e.g., ICG cell A 215A, ICG cell B 215B). As also shown in FIG. 2A, SR register A 185A includes a pair of MSEs (e.g., MSE A1 190A, MSE A2 195A), a pair of local multiplexers (MUXs) (e.g., local MUX A 220A, local MUX B 220B), a register output MUX 230, and a register input MUX 240. The components of SR register B 185B may be essentially the same as the components of SR register A 185A.

During both normal modes, save signal 175, restore signal 170, and scan enable signal 245 are low (e.g., "0"). Accordingly, during both normal modes, the ICG cells 215 pass clock signal 165 to the clock port of both MSEs (e.g., MSE A1 190A, MSE A2 195A), and both MSEs clock in the same data values arriving on data signal A 180A. During the first normal mode, register output MUX 230 may be operated to select the output port of MSE A2 195A for register output signal A 199A. During the second normal mode, register output MUX 230 may be operated to select the output port of MSE A1 190A for register output signal A 199A.

In one or more embodiments, the input data port (D) of control FF 205 is connected to the complement output port (Q) of control FF 205, while save signal 175 is connected to the clock port of control FF 205. With this configuration, the output port (Q) of control FF 205 toggles between low (e.g., "0") and high (e.g., "1") on every rising edge of save signal 175. The rising edge of save signal 175 triggers the start of a testing mode, while the falling edge of save signal 175 triggers the end of the testing mode. In other words, SR register system 100 is in a testing mode if save signal 175 is high/asserted. When save signal 175 is low, SR register system 100 is in one of the normal modes. In one or more embodiments, the first normal mode follows the first testing mode, while the second normal mode follows the second testing mode.

In one or more embodiments, SR register system 100 is in the first testing mode if the output port (Q) of control FF 205 is high while the save signal 175 is also high. In one or more embodiments, SR register system 100 is in the second testing mode if the output port (Q) of control FF 205 is low while save signal 175 is high. SR register system 100 toggles between the first testing mode and the second testing mode with every rising edge of saving signal 175.

In one or more embodiments, clock gate A 210A is connected to the output port (Q) of control FF 205, while clock gate 210B is connected to the complement output port (Q) of control FF 205. With this configuration, while save signal 175 is high, clock signal 165 is passed to the clock port of MSE A1 190A, or the clock port of MSE A2 195A, but not both. This causes the MSE not receiving clock signal 165 to hold the last data value received before the system went into the testing mode. In other words, the MSE not receiving clock signal 165 is the hold MSE.

In one or more embodiments, during a testing mode, scan enable signal 245 is asserted, and a test sequence is driven on scan input signal A 182A. This causes the MSE still receiving clock signal 165 to clock in the test sequence. In other words, the MSE still receiving clock signal 165 is the MSE under test. Moreover, during a testing mode, register output MUX 230 is operated to select the output port of the MSE under test for register output signal A 199A. As discussed above, the test sequence may be applied by a testing circuit or test apparatus. This same testing circuit or test apparatus may compare register output signal A 199A with expected values to determine whether the MSE under test is operating as expected, or whether the MSE under test has failed.

As shown in FIG. 2A, the output port of one MSE is connected to the input data port of the other MSE via a local MUX 220, and the selector port of each local MUX 220 receives restore signal 170. At the end of the testing mode, while save signal 175 is still high, restore signal 170 is asserted. This causes the MSE under test to clock in the data value stored by the hold MSE. In other words, asserting restore signal 170 causes the MSE under test to be restored to the value it held just prior to starting the testing mode. Asserting the restore signal 170 has no effect on the hold MSE because the hold MSE is not receiving clock signal 165. After restoring the MSE under test, restore signal 170, save signal 175, and scan enable signal 245 are set low (i.e., de-asserted), and SR register system 100 is back in one of the normal modes.

Those skilled in the art, having the benefit of this detailed description, will appreciate that the configuration shown in FIG. 2A enables logicBIST, which ensures the entire SR register design is testable in-system. Accordingly, the configuration shown in FIG. 2A can meet the high-levels of in-system test coverage demanded by various safety standards including ISO 26262 (i.e., the automotive safety standard).

Figure 2B:
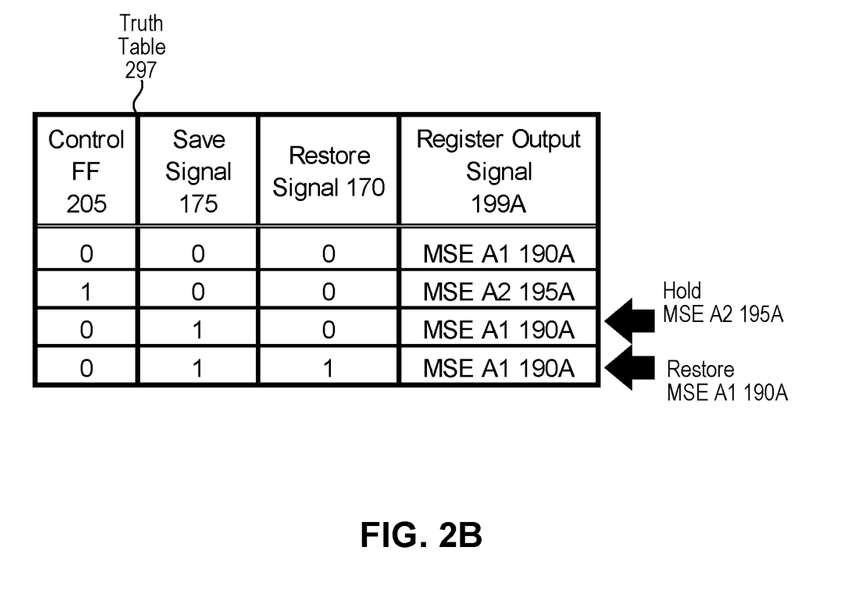
FIG. 2B depicts a truth table for the example SR register in accordance with one or more embodiments.

FIG. 2B shows truth table 297 in accordance with one or more embodiments. Truth table 297 corresponds to SR register A 185A, discussed above in reference to FIG. 2A. In the first row of truth table 297, the output of control FF 205, save signal 175, and restore signal 170 are all low (e.g., "0"). This corresponds to one of the normal modes. As shown in truth table 297, under these conditions, register output signal 199A is the output of MSE A1 190A.

In the second row of truth table 297, save signal 175 and restore signal 170 are both low (e.g., "0"). However, the output of control FF 205 is high (e.g., "1"). This corresponds to the other normal mode. As shown in truth table 297, under these conditions, register output signal 199A is the output of MSE A2 195A.

In the third row of truth table 297, the output of control FF 205 and restore signal 170 are both low (e.g., "0"). However, save signal 175 is high (e.g., "1"). This corresponds to one of the testing modes. Under these conditions, MSE A2 195A is the hold MSE, while A1 190A is the MSE under test. Accordingly, as shown in truth table 297, register output signal 199A is the output of MSE A1 190A.

In the fourth row of truth table 297, the output of control FF 205 is low (e.g., "0"). However, both save signal 175 and restore signal 170 are high (e.g., "1"). Under these conditions, A1 190A is the MSE under test and is being restored to the value held by MSE A2 195A. As shown in truth table 297, register output signal 199A is the output of MSE A1 190A.

Figure 3:
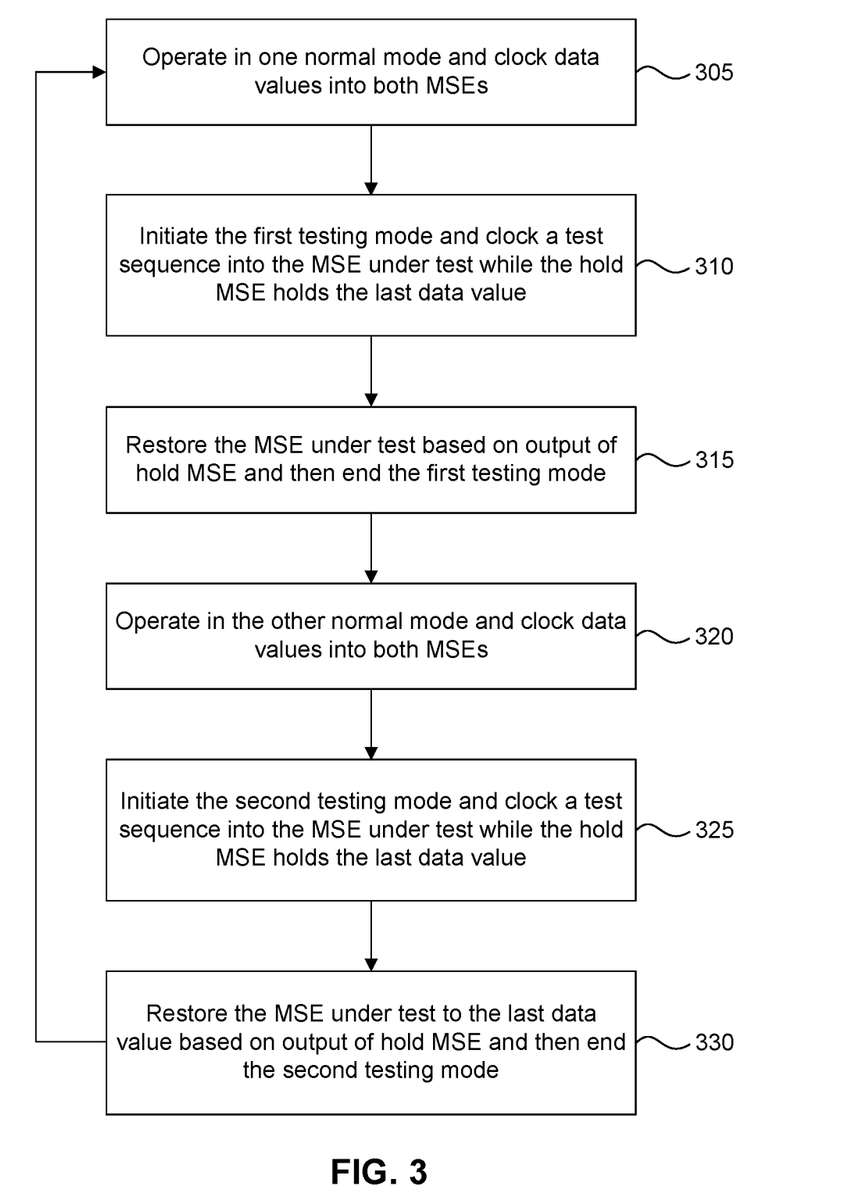
FIG. 3 depicts a flowchart for operating and testing a SR register in accordance with one or more embodiments.

FIG. 3 depicts a flowchart for operating and testing an SR register in accordance with one or more embodiments. In one or more embodiments, one or more of the steps depicted in FIG. 3 may be omitted, repeated, and/or performed in a different order than the order depicted in FIG. 3. Accordingly, the scope of the present method should not be considered limited to the specific arrangement of steps depicted in FIG. 3.

The method depicted in FIG. 3 shall be described with reference to FIG. 1 and FIG. 2A. However, the method is not limited to those example embodiments.

At 305, SR register A 185A is operated in one of the normal modes. In both normal modes, save signal 175 is low, restore signal 170 is low, and clock signal 165 is provided to both the MSEs (e.g., MSE A1 190A, MSE A2 195A). Both MSEs in SR register A 185 A (e.g., MSE A1 190A, MSE A2 195A) are clocking in the same data values arriving by data signal A 180 A (both MSEs store the same values at the same times). In this normal mode, control FF 205 operates register output MUX 230 to select the output of MSE A1 190. In other words, the selector port of register output MUX 230 is driven/controlled by an output port of control FF 205.

At 310, the first testing mode is initiated. The first testing mode may be initiated in response to a rising edge of save signal 175, received at the clock port of control FF 205. In response to the rising edge of save signal 175, control circuit 155 prevents clock signal 165 from reaching MSE A1 190A, effectively making MSE A1 190A the hold MSE. Accordingly, during the first testing mode, MSE A1 190A is storing the last data value received at 305. During the first testing mode, MSE A2 195A is the MSE under test. Accordingly, MSE A2 195A clocks in a test sequence arriving on scan input signal A 182A, and the control FF 205 drives register output MUX 230 to select the output of MSE A2 195A. The test circuit driving the test sequence may compare register output signal A 199A with expected values to determine whether MSE A2 195A is operating correctly, or whether MSE A2 195A has failed.

At 315, the MSE under test is restored to the last data value at 305 based on the output of the hold MSE (i.e., MSE A1 190A). Control circuit 155 may trigger the restore by sending a pulse on restore signal 170. The pulse causes local MUX B 220B to select the output of MSE A1 190A and feed it to the input data port of MSE A2 195A. Once MSE A2 195A is restored, both save signal 175 and restore signal 170 are de-asserted, ending the first testing mode and placing SR register A 185A in the other normal mode (i.e., not the same normal mode as 305).

At 320, SR register A 185A is operated in the other normal mode. 320 is essentially the same as 305, discussed above. However, in this normal mode, control FF 205 operates register output MUX 230 to select the output of MSE A2 195.

At 325, the second testing mode is initiated. The second testing mode may be initiated in response to the next rising edge of save signal 175 (i.e., the next rising edge of save signal 175 following the rising edge of save signal 175 that triggered the first testing mode). In response to this rising edge of save signal 175, control circuit 155 prevents clock signal 165 from reaching MSE A2 195A, effectively making MSE A2 195A the hold MSE. Accordingly, during the second testing mode, MSE A2 195A is storing the last data value received at 320. During the second testing mode, MSE A1 190A is the MSE under test. Accordingly, MSE A1 190A clocks in a test sequence arriving on scan input signal A 182A, and the control FF 205 drives register output MUX 230 to select the output of MSE A1 190A. The test circuit driving the test sequence may compare register output signal A 199A with expected values to determine whether MSE A1 190A is operating correctly, or whether MSE A1 190A has failed.

At 330, the MSE under test is restored to the last data value at 320 based on the output of the hold MSE (i.e., MSE A2 195A). Control circuit 155 may trigger the restore by sending a pulse on restore signal 170. The pulse causes local MUX A 220A to select the output of MSE A2 195A and feed it to the input data port of MSE A1 190A. Once MSE A1 190A is restored, both save signal 175 and restore signal 170 are de-asserted, ending the second testing mode and placing SR register A 185A back in the same normal mode as 305. The process may then return to 305.

As discussed above, SR register A 185A toggles between the first testing mode and the second testing mode with every rising edge of saving signal 175. Accordingly, SR register A 185A is completely checked in an in-system logicBIST environment once the logicBIST is run twice (i.e., the first testing mode and the second testing mode).

Figure 4:
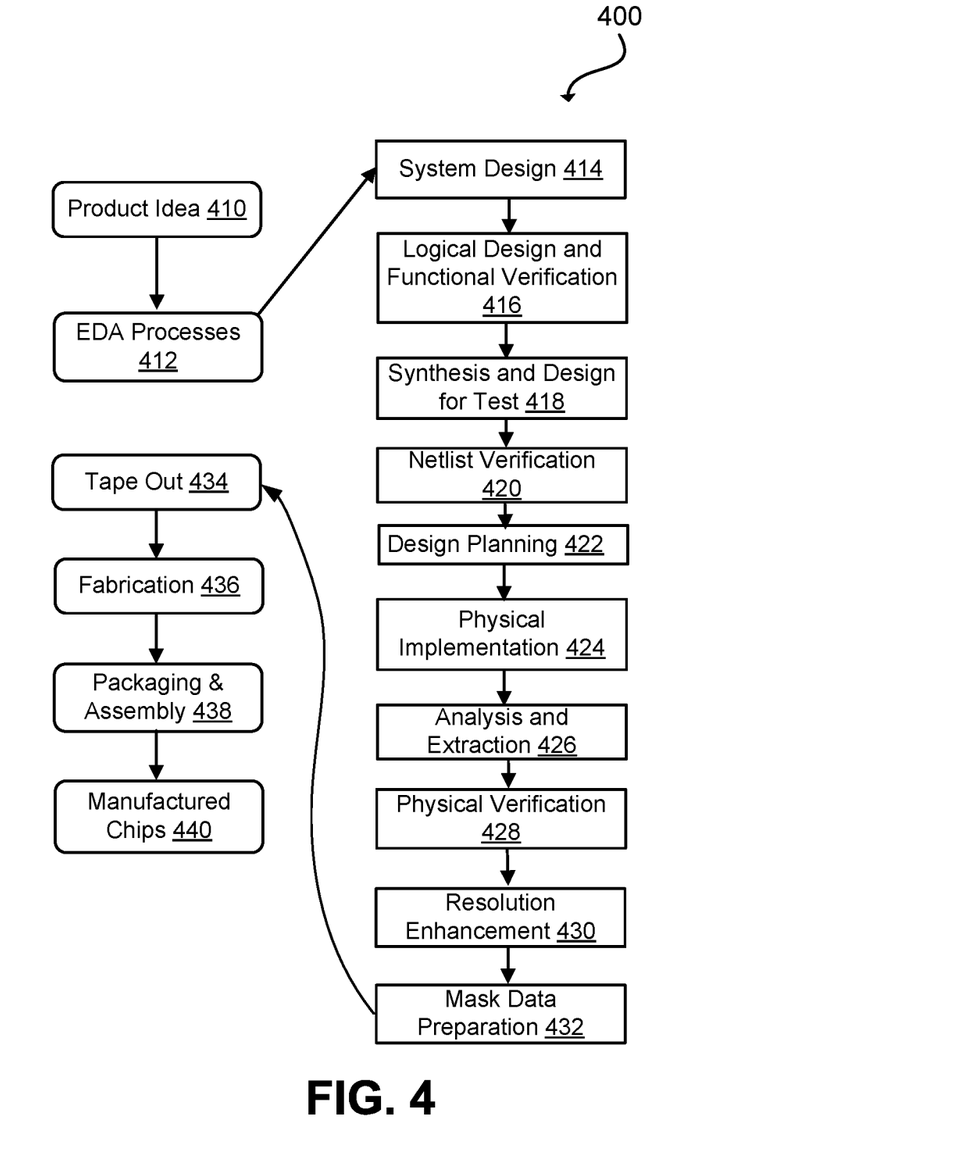
FIG. 4 depicts a flowchart of various processes used during the design and manufacture of an integrated circuit in accordance with some embodiments of the present disclosure.

FIG. 4 illustrates an example set of processes 400 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 410 with information supplied by a designer, information which is transformed to create an article of manufacture that uses a set of EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly processes 438 are performed to produce the finished integrated circuit 440.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 5. The processes described by be enabled by EDA products (or tools).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

Figure 5:
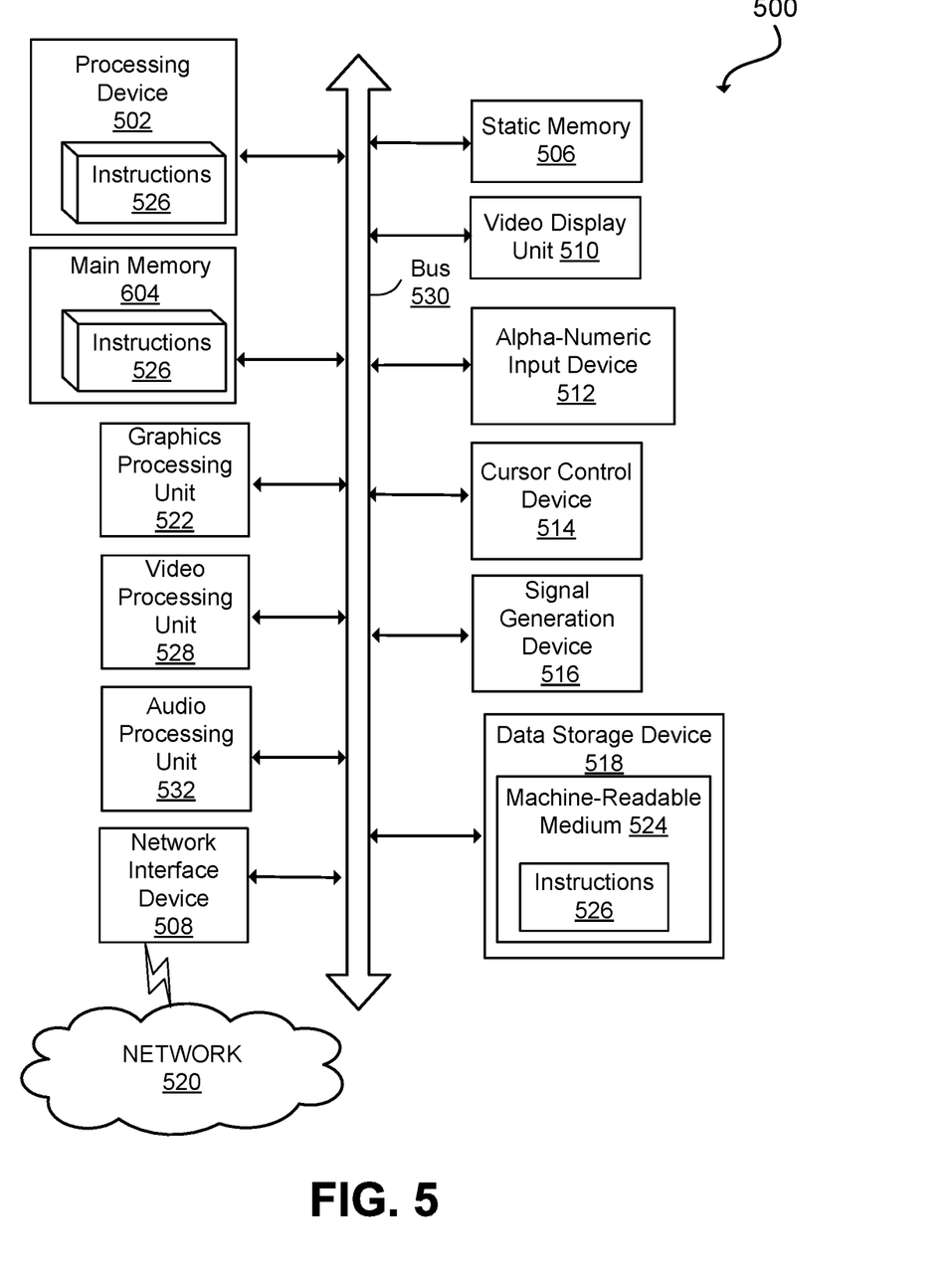
FIG. 5 depicts an abstract diagram of an example computer system in which embodiments of the present disclosure may operate.

A storage subsystem of a computer system (such as computer system 500 of FIG. 5 may be used to store the programs and data structures that are used by some or all of the EDA products described herein, and products used for development of cells for the library and for physical and logical design that use the library.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A system, comprising:
   a first memory state element (MSE) configured to:
     clock in a first data value during a normal mode,
     hold the first data value during a first testing mode, and
     clock in a first test sequence during a second testing mode;
   a second MSE configured to:
     clock in the first data value during the normal mode, and
     clock in a second test sequence during the first testing mode; and
   a control circuit configured to:
     restore the second MSE to the first data value based on an output port of the first MSE after the second MSE clocks in the second test sequence; and
     restore the first MSE based on an output port of the second MSE after the first MSE clocks in the first test sequence.

2. The system of claim 1, further comprising:
   a register output multiplexer (MUX) comprising a first input port connected to the output port of the first MSE and a second input port connected to the output port of the second MSE; and
   a register input MUX comprising a first input port configured to receive the first data value and a second input port configured to receive the first test sequence and the second test sequence.

3. The system of claim 2, further comprising:
   a first local MUX comprising a first input port connected to an output port of the register input MUX, a second input port connected to the output port of the second MSE, and an output port connected to an input data port of the first MSE; and
   a second local MUX comprising a first input port connected to the output port of the register input MUX, a second input port connected to the output port of the first MSE, and an output port connected to an input data port of the second MSE.

4. The system of claim 3, wherein the control circuit comprises:
   a control flip-flop (FF) comprising:
     a clock port configured to receive a save signal,
     a data input port,
     a first output port connected to a selection port of the register output MUX, and
     a second output port connected to the data input port of the control FF; and
   a restore signal connected to a selection port of the first local MUX and a selection port of the second local MUX.

5. The system of claim 4, wherein the second output port of the control FF outputs the complement of the first output port of the control FF, and wherein the restore signal is asserted at the end of the first testing mode while the save signal is asserted and at the end of the second testing mode while the save signal is asserted.

6. The system of claim 4, wherein the control circuit restores the second MSE to the first data value using a pulse on the restore signal.

7. The system of claim 4, wherein:
   the control FF transitions the first MSE to the first testing mode in response to a first rising edge of the save signal, and
   the control FF transitions the second MSE to the second testing mode in response to a second rising edge of the save signal.

8. The system of claim 4, wherein the control circuit further comprises:
   a first clock gate comprising a first input port connected to the first output port of the control FF and a second input port configured to receive the save signal;
   a second clock gate comprising a first input port connected to the second output port of the control FF and a second input port configured to receive the save signal;
   a first integrated clock gating (ICG) cell comprising a first input port connected to an output port of the first clock gate, a second input port configured to receive a clock signal, and an output port connected to a clock port of the first MSE; and
   a second ICG cell comprising a first input port connected to an output port of the second clock gate, a second input port configured to receive the clock signal, and an output port connected to a clock port of the second MSE.

9. The system of claim 8, wherein the first clock gate and the second clock gates are NAND gates.

10. The system of claim 1, further comprising:
    a third MSE configured to clock in a second data value during the normal mode and hold the second data value during the first testing mode; and
    a fourth MSE configured to clock in the second data value during the normal mode, wherein the first MSE and the second MSE belong to a first save and restore (SR) register,
wherein the third MSE and the fourth MSE belong to a second SR register, and
wherein the control circuit is further configured to:
  restore the third MSE based on an output port of the fourth MSE, and
  restore the fourth MSE with the second data value based on an output port of the third MSE.

11. The system of claim 10, wherein the first data value and the second data value are the same, and wherein the first test sequence and the second test sequence are the same.

12. The system of claim 1, wherein the first MSE and the second MSE are D-type flip-flops.

13. A method, comprising:
clocking a first data value into both a first memory state element (MSE) and a second MSE during a normal mode;
clocking a first test sequence into the second MSE during a first testing mode while the first MSE holds the first data value;
restoring the second MSE to the first data value based on an output port of the first MSE after the second MSE has clocked in the first test sequence;
clocking a second test sequence into the first MSE during a second testing mode; and
restoring the first MSE based on an output port of the second MSE after the first MSE has clocked in the second test sequence.

14. The method of claim 13, further comprising:
initiating, by a control circuit comprising a control flip-flop (FF), the first testing mode in response to a first rising edge of a save signal at a clock port of the control FF; and
initiating, by the control circuit, the second testing mode in response to a second rising edge of the save signal at the clock port of the control FF,
wherein the control FF comprises a data input port, a first output port, and a second output port,
wherein the second output port is a complement of the first output port, and
wherein the second output port is connected to the data input port.

15. The method of claim 14, further comprising:
driving, by the first output port of the control FF and during the second testing mode, a register output multiplexer (MUX) to select the output port of the first MSE; and
driving, by the first output port of the control FF and during the first testing mode, the register output MUX to select the output port of the second MSE.

16. The method of claim 14, wherein:
initiating the first testing mode comprises preventing a clock signal from reaching a clock port of the first MSE by driving a first integrated clock gating (ICG) cell based on the save signal and the first output port of the control FF,
the first ICG cell comprises an output port connected to the clock port of the first MSE,
initiating the second testing mode comprises preventing the clock signal from reaching a clock port of the second MSE by driving a second ICG cell based on the save signal and the second output port of the control FF, and
the second ICG cell comprises an output port connected to a clock port of the second MSE.

17. The method of claim 16, wherein driving the first ICG cell comprises performing a NAND operation on the save signal and the first output port of the control FF.

18. The method of claim 14, wherein:
restoring the first MSE comprises asserting a restoring signal causing a first local multiplexer (MUX) to select the output port of the second MSE,
the first local MUX comprises an output port connected to a data input port of the first MSE,
restoring the second MSE comprises asserting the restoring signal causing a second local multiplexer (MUX) to select the output port of the first MSE, and
the second local MUX comprises an output port connected to a data input port of the second MSE.

19. The method of claim 14, further comprising:
de-asserting the save signal after the first testing mode and after the second testing mode.

20. A system, comprising:
a first memory state element (MSE) configured to:
  clock in a first data value during a normal mode and hold the first data value during a first testing mode, and
  clock in a first test sequence during a second testing mode;
a second MSE configured to:
  clock in the first data value during the normal mode, and
  clock in a second test sequence during the first testing mode;
a control circuit configured to:
  restore the second MSE to the first data value based on an output port of the first MSE after the second MSE clocks in the second test sequence, and
  restore the first MSE based on an output port of the second MSE after the first MSE clocks in the first test sequence;
a register output multiplexer (MUX) comprising a first input port connected to the output port of the first MSE, a second input port connected to the output port of the second MSE, and a selector port connected to the control circuit; and
a testing circuit connected to an output port of the register output MUX and configured to:
  generate the first test sequence and the second test sequence, and
  determine at least one of the first MSE and the second MSE has failed by comparing a register output signal from the register output MUX with a plurality of expected values.

* * * * *